United States Patent [19]

Young

[11] Patent Number: 5,015,955

[45] Date of Patent: May 14, 1991

[54] MAGNETIC RESONANCE METHODS

[75] Inventor: Ian R. Young, Nr. Marlborough, England

[73] Assignee: Picker International, Ltd., Wembley, England

[21] Appl. No.: 456,460

[22] Filed: Dec. 26, 1989

[30] Foreign Application Priority Data

Dec. 23, 1988 [GB] United Kingdom ............... 8830095
Mar. 31, 1989 [GB] United Kingdom ............... 8907364

[51] Int. Cl.$^5$ ............................................. G01R 33/20
[52] U.S. Cl. ............................................. 324/309
[58] Field of Search ............... 324/300, 307, 309, 310, 324/311, 312, 318, 319, 320, 322; 128/653 A

[56] References Cited

U.S. PATENT DOCUMENTS

| | | | |
|---|---|---|---|
| 4,315,216 | 2/1982 | Clow et al. | 324/309 |
| 4,680,547 | 7/1987 | Leue | 324/309 |
| 4,698,591 | 10/1987 | Glover | 324/307 |
| 4,920,316 | 4/1990 | Egloff | 324/318 |
| 4,950,994 | 8/1990 | Glover | 324/320 |
| 4,965,521 | 10/1990 | Egloff | 324/312 |

FOREIGN PATENT DOCUMENTS 0215547 3/1987 European Pat. Off. .

OTHER PUBLICATIONS

Mansfield et al.; "Active Magnetic Screening of Gradient Coils in NMR Imaging", *Journal of Magnetic Resonance;* 66, 573-576 (1986).
Roemer et al.; "Self Shielded Gradient Coils", Proceedings of 5th Annual Meeting of Society of Magnetic Resonance in Medicine, Montreal, 1067-1068.

*Primary Examiner*—Michael J. Tokar
*Attorney, Agent, or Firm*—Timothy B. Gurin

[57] ABSTRACT

A method of reducing the effects of eddy currents produced by a gradient magnetic field pulse pattern applied to a body in a magnetic resonance method by selecting the rates of change of magnetic flux produced during the edges of the or each pulse of the pulse pattern in relation to the times elapsing between the edges and the time constants of the eddy currents.

7 Claims, 2 Drawing Sheets

MAGNETIC RESONANCE METHODS

This invention relates to magnetic resonance methods.

In magnetic resonance methods a static magnetic field is applied to a body under investigation to define an equilibrium axis of magnetic alignment in the region of the body being examined. A radio frequency (r.f.) magnetic field is then applied to the region being examined in a plane orthogonal to the static magnetic field direction to excite magnetic resonance in the region, and the resulting r.f. signals are detected and analysed.

During this sequence of operations one or more gradient magnetic fields are normally applied to the body, to cause excitation of magnetic resonance preferentially in the region of the body to be examined, to encode spatially the detected r.f. signals, and also for other purposes such as flow encoding. Such gradients are sometimes required to be applied for short periods only, i.e. in the form of pulses having a duration of the order of tens of milliseconds and are sometimes required to have relatively large magnitudes. As a result these gradient pulses sometimes produce rates of change of magnetic field in structures adjacent the examination region sufficient to induce eddy currents large enough and at such times, as to affect significantly the detected r.f. signals.

The structures in which such eddy currents are produced may include: supporting parts for magnets, some of which may be at room temperature and others at near absolute zero; coils for applying radio frequency fields to the body under investigation and detecting resultant r.f. signals; r.f. shields and cages; and room structures. As a consequence the eddy currents produced in an apparatus are unique to that apparatus and cannot easily be predicted.

Various methods of reducing the effects of such eddy currents have been proposed.

Some of these methods try to correct for the effects of eddy currents in time, i.e. by pre-emphasis or shaping of the current pulses used to produce the required gradient magnetic fields. However, such methods necessarily fail if the eddy current effects are not as predicted spatially. This, in practice, is frequently the case due to manufacturing tolerances, for example, when a tubular member in which an eddy current is produced is not in fact coaxial with a coil carrying a gradient field producing current pulse, as is assumed.

In other methods wherein an outer set of coils is wound in opposition to an inner set of coils to prevent field spreading outside the outer set of coils, i.e. so-called active shielding methods, correction for eddy currents induced in structures inside the outer set of coils, e.g. an r.f. detecting coil, is impossible.

It is an object of the present invention to provide a magnetic resonance method employing a novel technique for alleviating the effects of eddy currents produced by rapidly changing gradient magnetic fields.

According to the present invention in a magnetic resonance method wherein a gradient magnetic field is applied to a body by application of a gradient pulse pattern to the body, the effect of eddy currents produced by the gradient magnetic field is reduced by selection of the rate of change of magnetic flux produced during the edges of the or each pulse of said pulse pattern in relation to the times elapsing between said edges and the time constants of the eddy currents.

Normally said rates of change of flux are selected so as to reduce the eddy currents to a minimum at the termination of said pulse pattern.

In a preferred method according to the invention wherein the pulse pattern has N edges occurring in the time sequence 1 to N, the rates of change of flux $S_1$ to $S_N$ for the edges are selected by simultaneously solving equations of the form:

$$S_1 \exp.-(t_{1,N}/T_X) \ldots \ldots S_R \exp-(t_{R,N}/T_X) \ldots \ldots + S_N = 0$$

where $t_{R,N}$ is the time between the Rth edge and the Nth edge and in each equation $T_X$ is a different eddy current time constant.

In one particular method according to the invention wherein the top of each pulse has a finite slope, the value of the rate of change of flux $S_R$ for the trailing edge of each pulse in each equation is taken to be:

$$S_{RX} = S_{R-1}(1 + d(T_X/t_{R-1,R})(\exp(t_{R-1,R}/T_X)-1))\exp-(t_{R-1,R}/T_X)$$

where d is the fractional difference in amplitude between the leading and trailing edges of the pulse. One magnetic resonance (MR) method in accordance with the invention and apparatus for carrying out the method will now be described, by way of example with reference to the accompanying drawings in which.

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
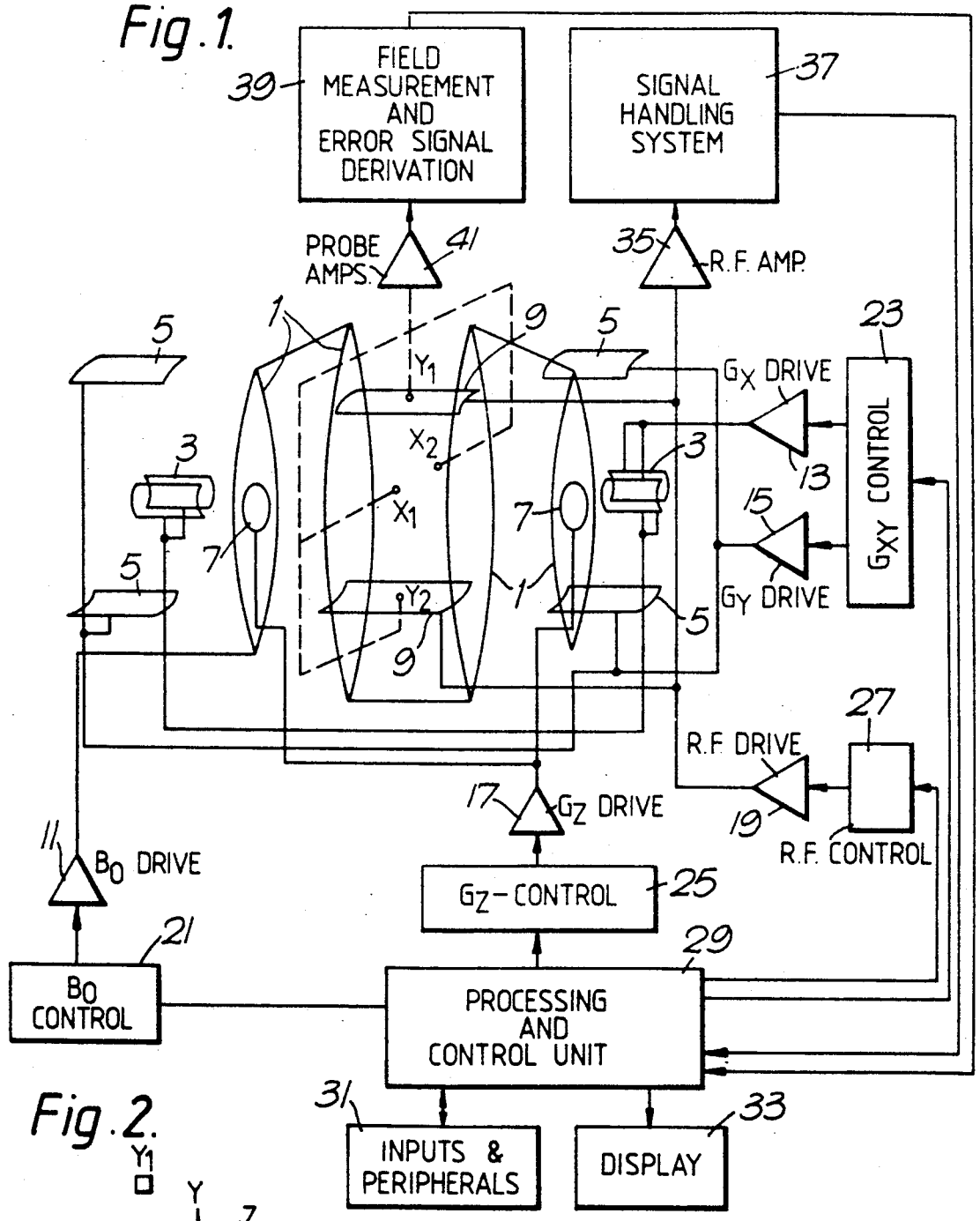
FIGS. 1 and 2 illustrate the apparatus diagrammatically.

Referring to FIG. 1, the first coil system comprises coils 1 which provide a steady uniform magnetic field $B_o$ in the Z-direction; coils 3 which provide a magnetic field gradient $G_x$ in the X-direction; coils 5 which provide a magnetic field gradient $G_y$ in the Y-direction; and coils 7 which provide a magnetic field gradient $G_z$ in the Z-direction.

In addition, the apparatus includes a second coil system 9 whereby r.f. magnetic fields can be applied to the body under examination in a plane normal to the direction of the magnetic field produced by the first coil system, and whereby r.f. magnetic fields resulting from nuclei in the body under examination which have been excited to magnetic resonance with a spin vector component other than in the Z-direction can be detected.

In the drawing a single pair of coils 9 is shown for both applying and detecting r.f. fields, but frequently it is preferable to provide separate coils for detecting the r.f. fields.

The various coils 1, 3, 5, 7 and 9 are driven by $B_o$, $G_x$, $G_y$, $G_z$ and r.f. drive amplifiers 11, 13, 15, 17 and 19 respectively, controlled by $B_o$, $G_{xy}$, $G_z$ and r.f. control circuits 21, 23, 25 and 27 respectively. These circuits may take various forms which are well known to those with experience of MR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The MR signals detected by the coils 9 are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an MR quantity in the body being examined.

It will be appreciated that whilst shown separately to clarify the present description, the signal handling system 37 may conveniently form part of the unit 29.

Figure 2:
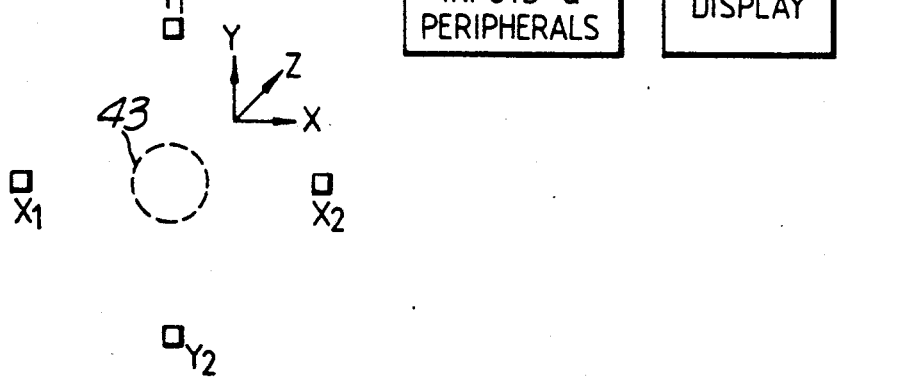

The apparatus also includes field measurement and error signal circuits 39 which receive signals via amplifiers 41 from field probes $X_1$, $X_2$, $Y_1$ and $Y_2$ which are disposed at suitable positions in relation to a slice of the body 43 being examined, as illustrated in FIG. 2, to monitor the applied magnetic fields.

Typical methods of using the apparatus to obtain an image of a selected slice of a body under examination will now be described.

The body to be examined is first positioned in the apparatus so that the region of the body containing the slice to be imaged is subject to the fields produced by the first and second coil systems.

The steady magnetic field $B_o$ is then applied in the Z-direction by means of coils 1, this field serving to define an equilibrium axis of magnetic alignment in the region of the body being examined, i.e. along the Z-direction, and remaining constant throughout the examination procedure.

A magnetic field gradient is then applied in a direction normal to the slice to be imaged by means of coils 3, 5 or 7 as appropriate. For the purposes of the present example the slice is taken to lie in the X-Y plane so that the applied gradient is in the Z-direction. Whilst this gradient $G_z$ is being applied an r.f. magnetic field pulse is applied by means of the coil system 9. The frequency of the r.f. pulse is chosen to be at the Larmor frequency of hydrogen protons in the slice of the body to be imaged. Since the strength of the magnetic field outside the slice differs from that in the slice, and hence the Larmor frequency of the hydrogen protons outside the slice differs from the frequency of the applied r.f. pulse, proton spins within the slice only are excited by the r.f. pulse. The integral of the r.f. pulse is such that the pulse is just sufficient to tip the spins of the excited protons through 90° i.e. in the present case from the Z-direction into the X-Y plane, the spins then recessing in the X-Y plane around the Z-axis.

Immediately after the gradient $G_z$ a gradient $-G_z$ in the reverse direction is applied to rephase the spins in the selected slice against dephasing resulting from the gradient across the slice during excitation, as described for example in UK Patent Specification No. 1,578,910.

The above described procedure produces a free induction decay (FID) signal which may be detected by means of coil system 9. In order to obtain sufficient data to construct a two-dimensional image from the detected signals, the spins must also be encoded in known manner to enable signals arising from different parts of the slice to be distinguished from one another.

This is achieved by the application of further magnetic field gradients in the plane of the slice after excitation and before and/or during detection of the FID signal, the particular gradients used depending on the method to be employed to construct an image from the detected signals.

For example, where a two-dimensional Fourier Transformation (2 DFT) technique is used to construct an image, the FID signal may be encoded by a phase encoding magnetic field gradient pulse $G_y$ applied after excitation and before detection and a frequency encoding magnetic field gradient $G_x$ applied during detection. To obtain a full set of data for an image, the excitation and detection sequence is repeated a number of times with different values of the phase encoding gradient $G_y$. In order to permit formation of an echo signal desirably disposed within the period of application of the gradient $G_x$, the gradient $G_x$ is preceded by a reverse gradient $-G_x$ in known manner.

If a projection image construction technique is used a frequency encoding gradient during detection only is employed and the detection sequence repeated for different directions of the encoding gradient in the slice.

Whilst, in principle, the present invention may be used in respect of any gradient magnetic field applied during a magnetic resonance investigation, in practice it is found that many gradients, e.g. those described above, can be applied without the resulting eddy currents seriously affecting the detected r.f. signals. Thus the present invention finds application in particular to relatively large magnetic field gradients applied at times when the resulting eddy currents may easily interfere with the detected r.f. signals, i.e. shortly before data collection, or before the application of a spin echo pulse.

One example of such large pulses is the gradient pulses used for flow encoding in MR sequences for measuring perfused blood flow in tissue. The various steps of one such sequence are illustrated in FIG. 3.

Figure 3:
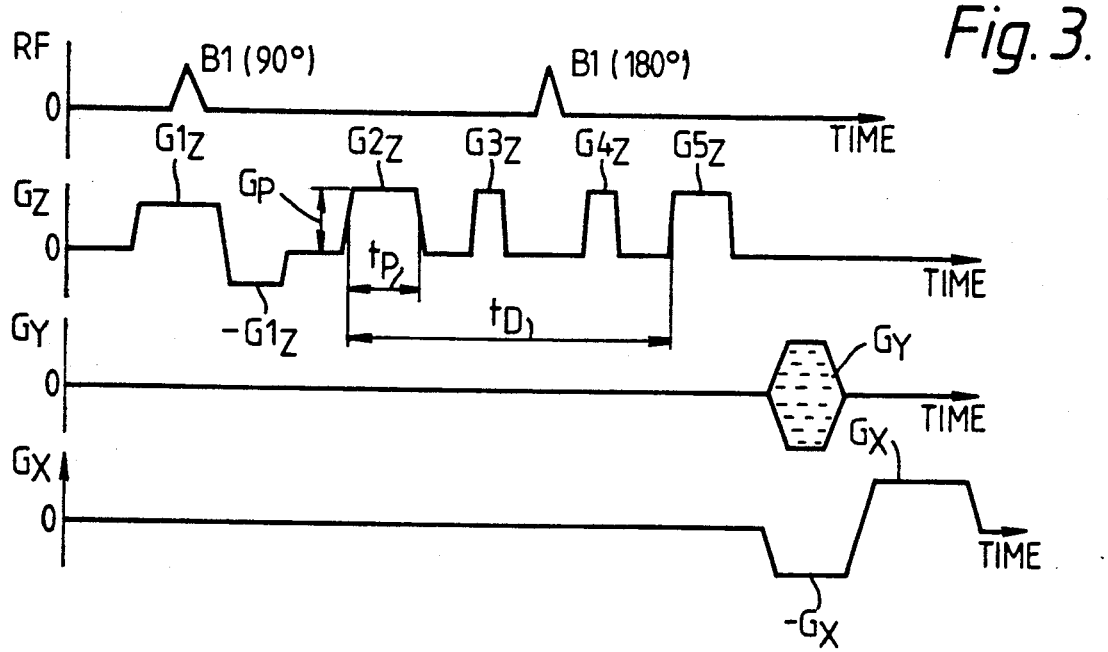
FIG. 3 illustrates a method of operation of the apparatus.

Referring to FIG. 3, a 90° r.f. excitation pulse B1(9O) is first applied in the presence of a slice selection gradient $G1_z$, the gradient $G1_z$ being followed by a rephasing reverse direction gradient pulse $-G1_z$, as described above. A first large flow encoding gradient pulse $G2_z$ is then applied followed at a time $t_D$ later by an identical flow encoding gradient pulse $G5_z$. Between the two flow encoding pulses there is applied a spin echo r.f. pulse B1(18O°) before and after which there are applied, in known manner, spoiler gradient pulses $G3_z$ and $G4_z$. After the second flow encoding pulse $G5_z$ there is applied a phase encoding gradient $G_y$, and data collection is carried out during application of a gradient $G_x$ preceded by a reverse gradient $-G_x$ as described above.

Figure 4:
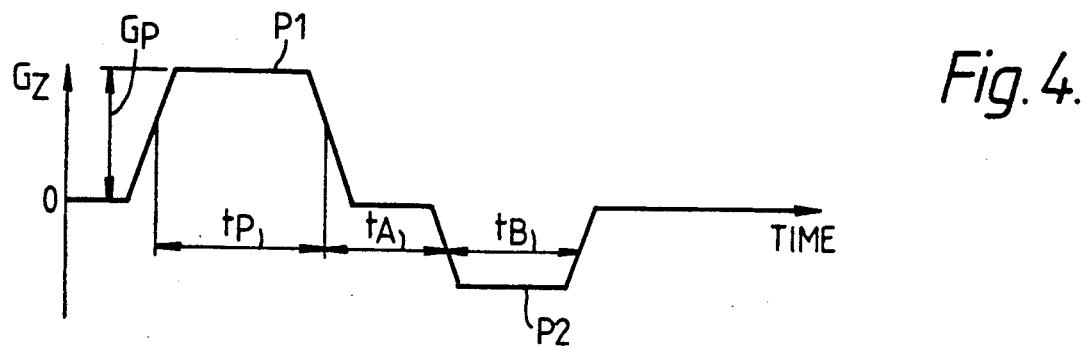
FIG. 4 illustrates a gradient magnetic field pulse pattern in accordance with the invention.

Flow is investigated by mapping phase change between views of a selected slice obtained using the sequence as shown in FIG. 3 and the same sequence without the pulses $G2_z$ and $G5_z$, the phase difference $\phi$ in a voxel due to flow being given by:

$$\phi = \gamma G_p t_p t_D v$$

where
$\gamma$ is the gyromagnetic ratio for hydrogen protons
$G_p$ is the magnitude of the gradient pulses $G_z$ and $G5_z$ $t_p$ is the duration of the gradient pulses $G2_z$ and $G5_z$; and v is the velocity of flow Application of the invention to the pulses $G2_z$ and $G5_z$ of FIG. 3 will now be described with reference to FIG. 4.

For the purposes of this example it is asumed that, by a measurement process described below, it has been determined that four significant eddy currents of time constants $T_A$, $T_B$, $T_C$ and $T_D$ have been found to occur. For such a case it is found that by suitable choice of the rates of change of magnetic flux $S_1$, $S_2$ occurring during the leading and trailing edges of a first gradient pulse P1, of magnitude $G_p$ and duration $t_p$ determined in dependence on the flow to be investigated, and of the rates of change of flux $S_3$ and $S_4$ occurring during the leading and trailing edges of a second reverse gradient pulse P2 of duration $t_B$ whose leading edge occurs at a time $t_A$ after the trailing edge of the first pulse P1, the first four eddy currents can be effectively zeroed. The time periods $t_p$, $t_A$ and $t_B$ are taken as extending from and to the mid-points of the relevant pulse edges. The slopes of the tops of the gradient pulses P1, P2 are assumed to be small compared with that of their edges so that their effects can be neglected.

Choice of the rates of change of flux $S_1$, $S_2$, $S_3$ and $S_4$ is effected using the equations:

$$S_1 \exp{-[(t_p+t_A+t_B)/T_A]} + S_2 \exp{-[(t_A+t_B)/T_A]} + S_3 \exp{-(t_Bt_B/T_A)} + S_4 = 0 \quad (1)$$

$$S_1 \exp{-[(t_p+t_A+t_B)/T_B]} + S_2 \exp{-[(t_A+t_B)/T_B]} + S_3 \exp{-(t_B/T_B)} + S_4 = 0 \quad (2)$$

$$S_1 \exp{-[(t_p+t_A+t_B)/T_C]} + S_2 \exp{-[(t_A+t_B)/T_C]} + S_3 \exp{-(t_B/T_C)} + S_4 = 0 \quad (3)$$

$$S_1 \exp{-[(t_p+t_A+t_B)/T_D]} + S_2 \exp{-[(t_A+t_B)/T_D]} + S_3 \exp{-(t_B/T_D)} + S_4 = 0 \quad (4)$$

By solving these equations simultaneously values for $S_1$, $S_2$, $S_3$ and $S_4$ are found such that the resultant eddy current at the four sites where the eddy currents of time constant $T_A$, $T_B$, $T_C$ and $T_D$ respectively arise is zero at the end of the second gradient pulse P2.

In one particular example of this procedure wherein only two eddy currents of time constants 19 msec and 195 msec respectively were identified and $t_p$, $t_A$ and $t_B$ had values of 22.5 msec, 5 msec and 7.5 msec respectively, values for $S_2$, $S_3$ and $S_4$ of 1.10 $S_1$, 0.75 $S_1$ and 0.91 $S_1$ respectively were obtained. It will be appreciated that $S_1$ will normally be chosen to suit the operator in dependence on apparatus capabilities. It is found in practice convenient to keep the rise and fall times of each gradient pulse constant at the limit of apparatus performance.

The rates of change of flux $S_1$, $S_2$, $S_3$ and $S_4$ are then controlled by the $G_Z$ drive amplifier 17, and its associated control circuit 25 in conjunction with the electrical characteristics of the associated coils 7.

It will further be appreciated that the values for $S_2$, $S_3$ and $S_4$ given above are merely one of an infinite number of solutions so that the operator is normally able to choose one of the possible solutions which best suits a particular application.

Figure 5:
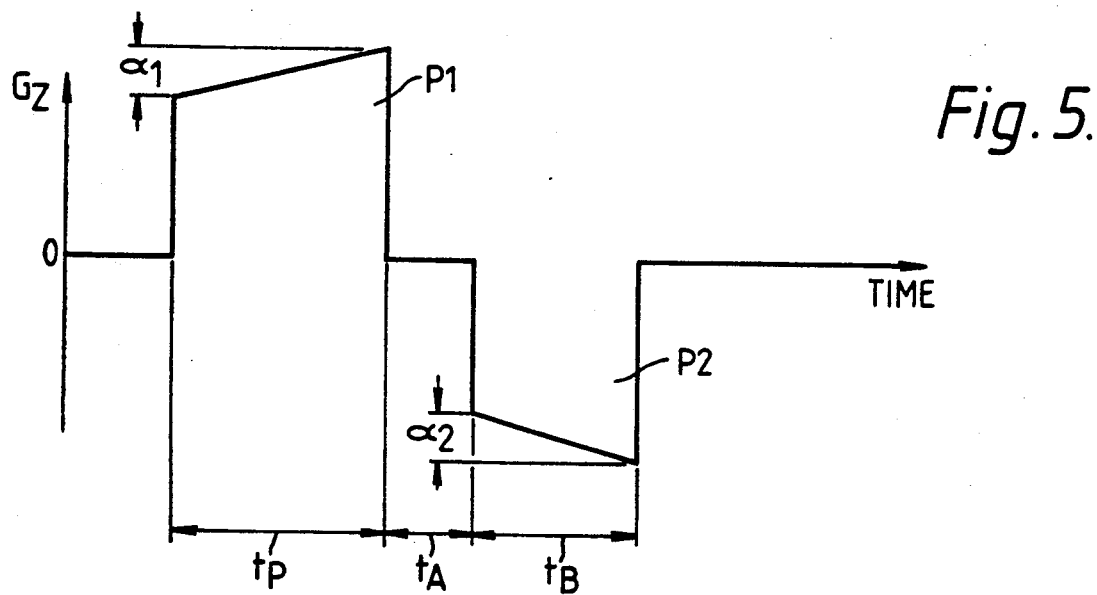
FIG. 5 illustrates an alternative form of the pulse pattern of FIG. 4. The apparatus is an imaging apparatus suitable for obtaining images of patients for medical diagnostic purposes.

In a modification of the procedure described above which allows for the slopes of the tops of the pulses P1 and P2 not being negligible and assumes the rise and fall times of the pulses P1 and P2 to be negligible compared with their durations, instead of using equations (1) to (4) above, the following equations are used:

$$S_1 \exp{-[(t_p+t_A+t_B)/T_A]} + S_{2A} \exp{-[(t_A+t_B)/T_A]} + S_3 \exp{-(t_B/T_A)} + S_{4A} = 0 \quad (5)$$

$$S_1 \exp{-[(t_p+t_A+t_B)/T_B]} + S_{2b} \exp{-[(t_A+t_B)/T_B]} + S_3 \exp{-(t_B/T_B)} + S_{4B} = 0 \quad (6)$$

$$S_1 \exp{-[(t_p+t_A+t_B)/T_C]} + S_{2C} \exp{-[(t_A+t_B)/T_C]} + S_3 \exp{-(t_B/T_C)} + 4C = 0 \quad (7)$$

$$S_1 \exp{-[(t_p+t_A+t_B)/T_D]} + S_{2D} \exp{-[(t_A+t_B)/T_D]} + S_3 \exp{-(t_B/T_D)} + S_{4D} = 0 \quad (8)$$

where $d_1$ and $d_2$ are the fractional differences in amplitude between the leading and trailing edges of the pulses P1 and P2 respectively; the time periods $t_p$, $t_A$ and $t_B$ are taken as extending from and to the upper or lower edges of the relevant pulse edges, as shown in FIG. 5; and $$S_{2X} = S_1(1+d_1(T_X/t_p)(\exp(t_p/T_X)-1)) \exp{-(t_p/T_X)}$$

$$S_{4X} = S_3(1+d_2(T_X/t_B)(\exp(t_B/T_X)-1)) \exp{-(t_B/T_X)}$$

The above procedures may also be conveniently used to prevent interference with the detected r.f. signals by eddy currents produced by the spoiler gradient pulses $G3_z$ and $G4_z$ of FIG. 3.

Another particular example of a gradient pulse to which the invention may be applied is a field echo rephasing gradient pulse in an angiography experiment.

It will be understood that whilst a gradient pulse pattern comprising two spaced pulses of opposite polarity has been described above by way of example, other pulse patterns may be used in other methods according to the invention. Each MR apparatus may be expected to exhibit its own pattern of eddy currents which can be eliminated using the method according to the invention. Thus, the precise strategy in accordance with the invention devised for use with any particular apparatus is a matter for the user.

In general in application of the method of the invention the number of pulse edges and hence pulses required to eliminate eddy currents may be expected to increase as the number of eddy currents of different time constant increases. Thus, where only a single eddy current is produced, it may be expected that a gradient pulse pattern comprising a single pulse only will be required and the eddy current eliminated by suitable choice of the slope of the trailing edge of the single pulse.

Measurement of the time constants of the eddy currents produced in a particular apparatus is conveniently carried out using a magnetic resonance probe, i.e. a probe which produces an output signal by virtue of excitation of magnetic resonance of material, e.g. doped water, contained in the probe. With the probe appropriately positioned the signal emitted by the probe when excited by an r.f. magnetic field pulse applied to the probe is recorded. Comparison of the signal recorded when the r.f. pulse is preceded by a gradient pulse designed to produce eddy currents with the signal recorded in the absence of the gradient pulse enables the magnetic fields persisting after the gradient pulse, i.e. due to eddy currents, to be analysed.

It will be understood that the method according to the invention has the advantages that it can be used without knowledge of or assumptions regarding the locations in which eddy currents are produced and can be applied regardless of the nature of the eddy currents. Furthermore, no apparatus modification is normally required, although the apparatus is required to provide good control of applied gradient pulses.

I claim:

1. A magnetic resonance method wherein a gradient magnetic field is applied to a body by application of a gradient pulse pattern to the body characterised in that the effect of eddy currents produced by the gradient magnetic field is reduced by selection of the rates of change of magnetic flux produced during the edges of the or each pulse of said pulse pattern in relation to the times elapsing between said edges and the time constants of the eddy currents.

2. A method according to claim 1 wherein said rates of change of flux are selected so as to reduce the eddy currents to a minimum at the termination of said pulse pattern.

3. A method according to claim 2 wherein the pulse pattern has N edges occurring in the time sequence 1 to N and the rates of change of flux $S_1$ to $S_N$ for the edges are selected by simultaneously solving equations of the form:

$$S_1 \exp-(t_{1,N}/T_X) \ldots \ldots S_R \exp-(t_{R,N}/T_X) \ldots . + S_N = 0$$

where $t_{R,N}$ is the time between the Rth edge and the Nth edge and in each equation $T_X$ is a different eddy current time constant.

4. A method according to claim 3 wherein the top of each said pulse has a finite slope and the rate of change of flux $S_R$ for the trailing edge of each pulse in each equation is taken to be:

$$S_{RX} = S_{R-1}(1 + d(T_X/t_{R-1,R}) \exp(t_{R-1,R}/T_X) - 1)) \exp-(t_{R-1,R}/T_X)$$

where d is the fractional difference in amplitude between the leading and trailing edges of the pulse.

5. A method according to claim 3 wherein each said edge is arranged to be of substantially the same duration.

6. A method according to claim 3 wherein said pulse pattern comprises two pulses of opposite polarity.

7. A method according to claim 1 wherein said gradient magnetic field is a flow encoding gradient in a sequence for measuring blood flow in the tissue of a patient.

* * * * *